United States Patent [19]

Diguet et al.

[11] 4,142,196
[45] Feb. 27, 1979

[54] POLYCHROMATIC MONOLITHIC SEMICONDUCTOR ASSEMBLY

[75] Inventors: Daniel Diguet; Michel Gaffre, both of Caen, France

[73] Assignee: U.S. Philips Corporation, New York, N.Y.

[21] Appl. No.: 861,650

[22] Filed: Dec. 19, 1977

Related U.S. Application Data

[63] Continuation of Ser. No. 701,656, Jul. 1, 1976, abandoned.

[30] Foreign Application Priority Data

Jul. 8, 1975 [FR] France ............................... 75 21402

[51] Int. Cl.² ........................................... H01L 33/00
[52] U.S. Cl. ........................................ 357/17; 357/16; 357/48

[58] Field of Search ............................. 357/17, 16, 48

[56] References Cited

U.S. PATENT DOCUMENTS 3,942,065   3/1976   Russ ..................................... 313/500

Primary Examiner—Martin H. Edlow
Attorney, Agent, or Firm—Thomas A. Briody

[57] ABSTRACT

Polychromatic assembly comprising several electroluminescent semiconductor diodes that are formed by diffusion of islands localized in superimposed epitaxial layers, which layers are of different compositions and are deposited on a semiconductor substrate or a semi-insulator, each epitaxial layer having a forbidden bandwidth smaller than that of the layer below which it is present.

8 Claims, 3 Drawing Figures

POLYCHROMATIC MONOLITHIC SEMICONDUCTOR ASSEMBLY

This is a continuation of application Ser. No. 701,656, filed July 1, 1976, now abandoned.

BACKGROUND OF THE INVENTION

The present invention relates to a polychromatic monolithic semiconductor assembly comprising several electroluminescent diodes emitting in different wavelength ranges and formed by a substrate on which at least two epitaxial layers are superimposed.

The present invention also relates to a method of manufacturing said monolithic semiconductor device.

Electroluminescent diodes are used for visual display purposes, notably in the techniques of data processing. A binary logic state may be displayed by means of an electroluminescent diode having two states: illuminated indicator, extinguished indicator. However, in the case of strong ambient light, the reflection effects upon the optics of the indicator may entail interpretation errors. For that reason it is to be preferred to display the various logic states by means of indicators having several colours, for example, a red indicator and a green indicator. A first possibility consists in placing the required indicators besides each other, each having its own envelope and optics. The space required by such an arrangement rapidly becomes prohibitive.

In order to avoid this drawback it has been tried to manufacture devices comprising two superimposed indicators, one emitting red, the other emitting green, while using for one of them a material which is transparent to the light emitted by the other.

Such a device is described notably in French Patent Specification 2,069,256. However, the transparency of the regions emitting green light is not perfect. In addition, the manufacture of the structure requires a large number of delicate operations to obtain materials of alternate conductivity types susceptible to forming junctions presenting a good radiation efficiency as well as an adequate transparency. Moreover these devices necessitate local etching operations for making contacts on different planes, which operations present risks and numerous difficulties.

OBJECT OF THE INVENTION

It is the object of the present invention to mitigate the drawbacks of the known devices mentioned above and to manufacture an electroluminescent diode assembly of different colors integrated in the same monolithic substrate having a plane structure, while employing for its manufacture methods which have already been tested in the manufacture of semiconductor devices, for example, transistors or integrated circuits.

It is to be noted that the expression "different composition" used hereinafter for a semiconductor compound is related to materials comprising one or several different constituents, or the same constituents in different proportion or different doping elements giving them different emission spectra. Also, the expression "forbidden bandwidth" of a material is to be understood to mean the range of energy levels corresponding to the minimum energy of the recombination transitions in said material, knowing that said transitions are produced either between the conduction band and the valency band or between the band and an impurity level or between impurity levels.

DESCRIPTION OF THE INVENTION

According to the invention, the polychromatic monolithic semiconductor assembly comprises several electroluminescent diodes emitting in different wavelength ranges and formed by a flat substrate on which at least two epitaxial layers are superimposed. The diodes emit in different ranges and are formed by diffused regions extending down to the interior of epitaxial layers of different compositions, starting from distinct areas situated near each other and localized on the surface of the same emission plane. Each layer presents a forbidden bandwidth which is smaller than that of the overlying layer so that the respective forbidden bandwidths of the various layers decrease in the direction from the uppermost such layer to the lowest such layer.

Since the different regions are diffused down to the interior of layers having different compositions and different forbidden bandwidths, the active parts of the regions adjoining the junctions emit radiation in different wavelength bands. Since the different emitting regions are situated beside each other, the drawbacks due to the superposition of the regions emitting light of different colors are eliminated. The light issued by an active part situated in a deep epitaxial layer traverses only the upper epitaxial layer or layers which are transparent due to their greater forbidden band width.

The difference in forbidden bandwidth between an underlying layer and the layer covering it produces a limitation of the radiative recombinations in the first layer as a result of the presence of the potential barrier, which potential barrier is due to the difference in forbidden bandwidths. The emission corresponding to a region diffused down to a deep layer and traversing other less deep layers is hence confined in the deep layer and its colour is only determined by the material of the deep layer.

The assembly of the diodes not superimposed but distinct and well delimited is perfectly visible and suppresses any risk of interpretation errors of the color.

The light emissions of different color appear in adjoining planes and emanate through a same surface plane, which facilitates the arrangement of a protective material or of common optics while improving the visibility.

Besides, it is to be noted that for the manufacture of the device, as will be described hereinafter the only operations that are required are those using tested methods, the local etching treatments being notably eliminated completely.

In a preferred embodiment, the depth of each diffused region, taken between the junction and the upper face of the epitaxial layer where the junction is situated, is at least equal to a diffusion length of minority carriers in this part of the region, which corresponds to an optimum recombination efficacy.

The assembly according to the invention is preferably manufactured from materials which are known for their good electroluminescent properties and which can be deposited in compatible epitaxial layers, such as the semiconductor compounds comprising at least one element of column III of the Mendeleev Table and at least one element of column V; the epitaxial layers are preferably doped so as to have the n conductivity type, the regions diffused to form the junction being of the p conductivity type.

In the case in which it is desired to manufacture a luminous assembly capable of displaying two colors, red and green, the assembly advantageously comprises two epitaxial layers: one epitaxial surface layer made of a compound comprising at least gallium and phosphorus for example gallium phosphide GaP, preferably doped with nitrogen to emit a green colour, and an underlying layer made of a compound comprising at least gallium and arsenic, for example gallium arsenide phosphide, $GaAs_{1-x}P_x$, (in which $x > 0.6$) doped to emit a red light, the substrate on which the latter layer is deposited being, for example, of gallium phosphide. The conditions of color, difference of forbidden bandwidth and compatibility of crystal lattice are combined in this case. Moreover, such materials are in current practice in the manufacture of semiconductor devices, known up till now in the field of optoelectronics.

It will be obvious that, when required by the dimensions of the lattice constants of the materials of adjacent layers, layers of intermediate composition are deposited between said layers, constituting a so-called "coupling" medium. According to known methods, preferably the composition of such coupling layers varies progressively from one layer to another.

According to a modified embodiment, a III–V compound comprising aluminum is used for at least one of the layers. For example, a layer is made from gallium arsenide, $Ga_{1-y}Al_yAs$, wherein $y > 0.6$, emitting a yellow light, or wherein $y > 0.4$, emitting a red light.

Other III-V compounds may also be used including: for an emission of green color InAlP, GaAlP, for an emission of yellow colour GaInP.

According to a modified embodiment, a material emitting in the near infrared is used for the deepest layer, and a layer of material capable of converting the wavelength is disposed on the corresponding diffusion region. The deepest layer hence emits an infrared radiation to which the surface layer is transparent, and the converting layer absorbs the infrared radiation and re-emits in the visible spectrum. For example, a diffused junction is realized in a deep layer of gallium arsenide or gallium and indium arsenide (GaInAs) and a layer of a converting material, for example $Y_{0.84}Yb_{0.15}Er_{0.01}F_3$ emitting light of a green color, is disposed on the diffusion region of the region corresponding to the junction.

According to a particular modified embodiment of the invention, the substrate on which the epitaxial layers are deposited is manufactured from a material having a low resistivity, which presents, in addition, is suitable for epitaxial deposits. A connection is disposed on the substrate and connection means are provided for each of the sites of the diffused regions. For example, the substrate has a resistivity of between 0.05 and 5 Ohm cm and a metallic layer is deposited on the face opposite to the emission face. On the emission face, contacts are made on each diffused region by localized metallization deposits in such manner as to minimize the screening of the emissive surface. In this manner a device is obtained which, for two emitted colors, is controlled by the intermediary of two independent connections and a common point.

According to another particular embodiment, the substrate on which the epitaxial layers are deposited is made from a material having a high resistivity, giving at least a semiconducting character. Insulation zones forming insulating partitions between the diffused electroluminescent regions are disposed from the surface of the emission plane down to the interior of the substrate. The insulation zones can be realized according to known methods. They are, for example, diffused zones of a conductivity type opposite to that of the epitaxial layers, forming with these layers, junctions that can possibly be inversely polarized to ensure insulation.

Thus, the electroluminescent diodes are insulated in compartments formed on the substrate which permits controlling them with only two terminals if the device comprises only two diodes. For this purpose, the device comprises means for arranging in parallel two diodes emitting light of different color, the two diodes being mutually connected in the inverse direction. Hence one diode is polarized directly and emits its radiation when the other is reversely polarized and remains nonradiative.

The invention also relates to a method of manufacturing the device described above. According to the invention, the method of manufacturing a semiconductor structure comprising an assembly of electroluminescent diodes emitting radiation in various wavelength ranges, comprises steps in which materials having increasingly large forbidden bandwidths are deposited by epitaxy in successive layers on a flat substrate, after which successive impurity diffusions giving the conductivity type opposite to that of such layers is carried out from the surface of the epitaxial surface layer, at areas which are adjacent each other and have different depths reaching the various deposited layers.

This method requires only epitaxial and diffusion methods such as those which are already used in the manufacture of diodes, transistors or integrated circuits.

In the preferred embodiment of the method, the various epitaxial layers are deposited in a single continuous operation during which the proportions of the various sources of elements to be deposited are modified as a function of the variation of the composition of the material of the successive layers. For example, the layers of GaAsP and GaP are deposited on a substrate of GaP or GaAs with the interposition of coupling layers of gradually modified composition, in a single epitaxial operation either from the vapor phase or from the liquid phase.

The present invention can be applied to the manufacture of polychromatic luminous assemblies, indicators, display devices, in particular logic state display devices.

BRIEF DESCRIPTION OF DRAWINGS

The invention will be described in greater detail, by way of example, with reference to the accompanying drawing.

FIG. 3 is a plan view of the same assembly of which FIG. 2 is the sectional view taken on the line II—II.

PREFERRED EMBODIMENT

In the following description, the materials chosen are III-V compounds of which the GaP can be used the substrate and the GaAsP for epitaxial layers, but it will be obvious that the operations described would be entirely identical if other compounds were concerned.

Figure 1:
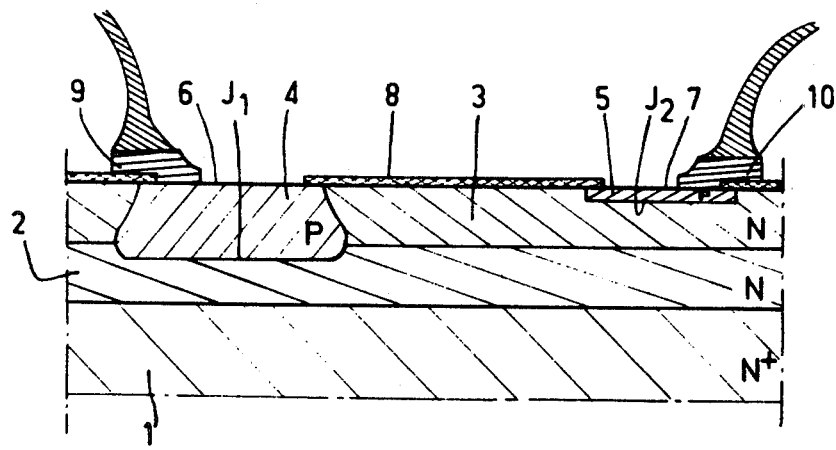
FIG. 1 is a diagrammatic sectional view of a first embodiment of an assembly of electroluminescent diodes according to the invention.

Referring now to FIG. 1, the structure of the assembly of diodes according to the invention comprises a substrate 1 covered by two superimposed epitaxial layers 2 and 3 of n conducivity type. Provided in the layers 2 and 3 are islands 4 and 5 of the p conductivity type which, with the n type layers 2 and 3, form the junctions $J_1$ and $J_2$. The deep junction $J_1$ emits, for example, red and the junction $J_2$ emits green.

In order to obtain such an assembly of integrated electroluminescent diodes, the starting material is a substrate 1 of gallium phosphide GaP, for example, of n conductivity type, doped with sulphur or tellurium in a concentration of carriers of $2 \times 10^{17}$ to $7.10^{17}$ atoms/cm$^3$, thus presenting a resistivity between 0.1 and 0.3 Ohm.cm. A first epitaxial layer 2 of GaAsP is grown on the substrate 1 and a further epitaxial layer 3 of GaP is progressively formed on the layer 2. Since the layers 1, 2, and 3 are, respectively, GaP, GaAsP and GaP, they are obtained in a slightly different manner and in a single cycle. In fact, on the substrate 1 there is provided a so-called coupling layer which consists of a layer of GaAs$_y$P$_{(1-y)}$ in which y varies gradually from 0 to 0.35, then on said coupling layer is grown an epitaxial layer of GaAs$_{0.35}$P$_{0.65}$. After obtaining the desired thickness of GaAsP, the arsenic content is progressively diminished from 0.35 to 0, providing a further coupling layer and finally form the surface layer 3 of GaP. The layer 2 may be doped with tellurium with a concentration between $6 \times 10^{16}$ and $2 \times 10^{17}$ at/cm$^3$ and the layer 3 may be doped with sulphur with a concentration of between $4 \times 10^{16}$ and $10^{17}$ at/cm$^3$. The n type doping may possibly be obtained from doping impurities such as silicon.

Through open windows 6 and 7 in an oxide layer 8 previously deposited on the surface of the layer 3, at least two diffused islands of the p conductivity type are made in the layer 3, one island 4 being deep and reaching and penetrating into the layer 2 and the other island 5, being a surface layer.

The islands 4 and 5 are obtained by the usual diffusion methods, the doping impurity used usually being zinc, but it also being possible that it be cadmium, beryllium, or magnesium.

In the case of a zinc diffusion, the impurity concentration used is chosen in the range of $10^{19}$ to $10^{20}$ at/cm$^3$, preferably $2 \times 10^{19}$ at/cm$^3$.

Contacts 9 and 10 are made on the islands 4 and 5, respectively, while another contact (not shown in the Figure) is made on the outer surface of the substrate 1.

Figure 2:
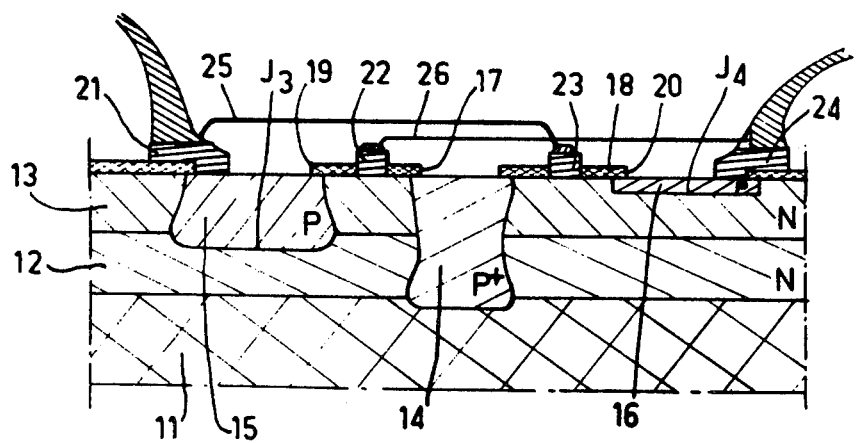
FIG. 2 is a diagrammatic sectional view of a second embodiment of an assembly of electroluminescent diodes according to the invention.
Figure 3:
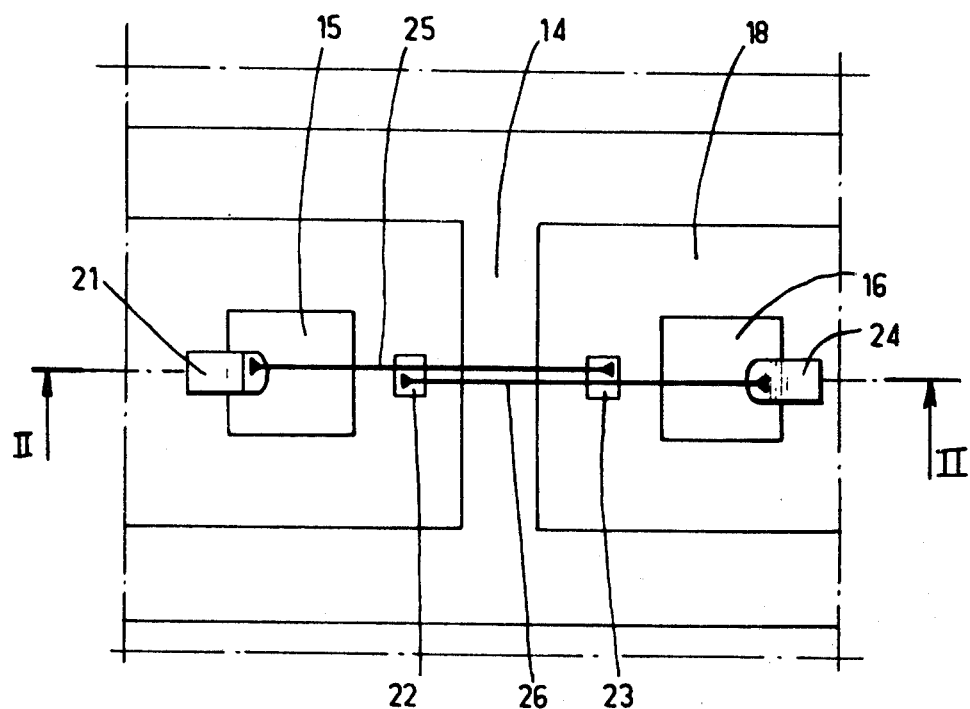

In the second embodiment shown in FIGS. 2 and 3, the two diodes are integrated in the same assembly and are insulated from each other in compartments formed on the same substrate, such insulation permitting the control the diodes separately and alternatively.

As shown in the Figures, the structure of the assembly according to the invention comprises a substrate 11 covered by two superimposed epitaxial layers 12 and 13 of n conductivity type.

An insulation partition 14 highly doped with p-type impurities divides the layers 12, 13 into two compartments or caissons in which two localized islands 15 and 16 of the p-type have been created. These islands 15 and 16 form the junctions $J_3$ and $J_4$ with the layers 12 and 13, respectively. The deep junction $J_3$ emits, for example, red and the junction $J_4$ emits green.

In order to obtain this assembly of integrated electroluminescent diodes, the starting material is a substrate 11 of semi-insulating gallium phosphide GaP, having a resistivity of between $10^4$ and $10^7$ Ohm.cm. The layers 12 and 13 are grown epitaxially on the substrate 11. The layer 12 may be of GaAsP extended by GaP in the layer 13. These two layers 12, 13 may be obtained in a single cycle as in the preceding example and their impurity concentrations, as well as their resistivity, may be identical to those described above.

By a deep diffusion of p-type impurities starting from the open window 17 in the oxide layer 18 deposited previously, the insulation partition 14 is formed. This partition 14, which penetrates into the substrate 11, produces at least two compartments.

In a first compartment and starting from an open window 19 in the oxide layer 18, the deep p-type island 15 is diffused, which penetrates into the layer 12 and produces with layer 12 the junction $J_3$. In a second compartment and starting from an open window 20 in the oxide layer 18, the p-type island 16 is diffused, which penetrates only into the layer 13 and forms with layer 13 the junction $J_4$.

The islands 14, 15 and 16 are obtained by the usual diffusion methods, the doping impurity usually being zinc. In the case of a zinc diffusion, the impurity concentration may be, for example, of the order of $5 \times 10^{19}$ at/cm$^3$ for the island 14 and between $10^{19}$ and $10^{20}$ at/cm$^3$ for the islands 15 and 16, for example, $2.10^{19}$ at/cm$^3$.

Contacts 21, 22, 23 and 24, respectively, are made on the island 15, on the part of the layer 13 located at the first compartment, on the part of the layer 13 located at the second compartment, and on the island 16 of the second compartment.

The electric connections between the various contacts are effected, for example, by means of wire connections 25 and 26 which are fixed by soldering or by thermocompression.

In a modified embodiment the wire connections may be replaced by coplanar connections obtained, for example, by metallization in a vacuum.

What is claimed is:

1. A polychromatic semiconductor assembly, comprising and formed by:
   (a) a semiconducting substrate,
   (b) at least two semiconductor epitaxial layers superimposed on said substrate, said layers having respective forbidden bandwidths that decrease in the direction from the uppermost to the lowest said layer, the overmost said layer comprising a surface, wherein said layers consist essentially of III-V compound of n-type conductivity and said diffused regions are of p type
   (c) plural electroluminescent diodes emitting radiation in different wavelength ranges and comprising diffused regions that are of different compositions, said regions being located at respective areas of said surface situated near each other and localized at said surface, said regions extending down to the interior of different respective said epitaxial layers and forming diode junctions therewith.

2. An assembly as in claim 1, wherein the epitaxial surface layer consists essentially of a compound comprising as constituents from groups III and V, respectively at least Ga and P and emitting a green light and said underlying layer consists exxentially of a compound comprising at least Ga and As and emitting a red light.

3. An assembly as in claim 1, wherein at least one of said layers comprises aluminum, thereby the augmenting the difference in forbidden bandwidth between a layer and its respective overlying layer.

4. An assembly as in claim 1, comprising a surface layer of GaP doped to emit a green light and an underlying layer of $GaAs_{1-x}P_x$ doped to emit a red light, where $x > 0.6$.

5. An assembly as in claim 1, wherein a said diode that is comprised by the deepest one of said layers emits an infrared light and said assembly further comprises a layer adapted to convert said infrared light, said converting layer being disposed over said diode.

6. An assembly as in claim 1, wherein said substrate has a low resistivity, said assembly comprising connection means disposed on said substrate, on the one hand, and on each of the areas of such diffused regions, on the other hand.

7. An assembly as in claim 1, wherein said substrate has a high resistivity giving it at least the character of a semi-insulator, said assembly comprising insulation zones forming an insulation partition between said diffused region, said zones extending from the surface of the emission plane down to the interior of said substrate.

8. An assembly as in claim 7, comprising connection means in parallel with said two diodes that emit light of different colors, one said diode being polarized directly while the other is reversely polarized.

* * * * *

UNITED STATES PATENT AND TRADEMARK OFFICE
CERTIFICATE OF CORRECTION

PATENT NO. : 4,142,196
DATED : February 27, 1979
INVENTOR(S) : DANIEL DIGUET ET AL It is certified that error appears in the above-identified patent and that said Letters Patent are hereby corrected as shown below:

Claim 1, line 10, delete "and said diffused"
         line 11, delete "regions are of p type"
         line 13, "comprising" should be --comprising p type--

Claim 2, line 5, "exxentially" should be --essentially--

Signed and Sealed this

Twenty-eighth Day of August 1979

[SEAL]

Attest:

LUTRELLE F. PARKER
*Attesting Officer*    *Acting Commissioner of Patents and Trademarks*